(12) United States Patent
Chu et al.

(10) Patent No.: US 12,094,816 B2
(45) Date of Patent: Sep. 17, 2024

(54) SEMICONDUCTOR STRUCTURE HAVING DEEP METAL LINE AND METHOD FOR FORMING THE SEMICONDUCTOR STRUCTURE

(71) Applicant: TAIWAN SEMICONDUCTOR MANUFACTURING COMPANY, LTD., Hsinchu (TW)

(72) Inventors: Wei-Chen Chu, Hsinchu (TW); Chia-Tien Wu, Hsinchu (TW); Chia-Wei Su, Hsinchu (TW); Yu-Chieh Liao, Hsinchu (TW); Chia-Chen Lee, Hsinchu (TW); Hsin-Ping Chen, Hsinchu (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 246 days.

(21) Appl. No.: 17/460,859

(22) Filed: Aug. 30, 2021

(65) Prior Publication Data

US 2023/0067527 A1 Mar. 2, 2023

(51) Int. Cl.
  *H01L 23/522* (2006.01)
  *H01L 21/768* (2006.01)
  *H01L 23/532* (2006.01)

(52) U.S. Cl.
  CPC .... *H01L 23/5226* (2013.01); *H01L 21/76805* (2013.01); *H01L 21/76877* (2013.01); *H01L 23/53223* (2013.01); *H01L 23/53238* (2013.01); *H01L 23/53266* (2013.01); *H01L 23/5329* (2013.01)

(58) Field of Classification Search
  CPC .......... H01L 23/5226; H01L 23/53223; H01L 23/53238; H01L 23/53266; H01L 23/5329; H01L 21/76805; H01L 21/76877; H01L 21/7682; H01L 21/76895; H01L 21/76885; H01L 21/823475; H01L 27/088
  See application file for complete search history.

(56) References Cited

U.S. PATENT DOCUMENTS

| | | | | |
|---|---|---|---|---|
| 5,684,331 A | * | 11/1997 | Jun ................... | H01L 21/76885 257/E21.582 |
| 8,288,279 B1 | * | 10/2012 | Ho ...................... | H10B 12/485 438/300 |
| 2002/0171147 A1 | * | 11/2002 | Yew .................. | H01L 21/76805 257/E23.145 |
| 2009/0121356 A1 | * | 5/2009 | Nakagawa .......... | H01L 23/5222 257/E23.161 |
| 2012/0104471 A1 | * | 5/2012 | Chang ............... | H01L 21/76838 257/E21.409 |

(Continued)

*Primary Examiner* — Shahed Ahmed
*Assistant Examiner* — Vicki B. Booker
(74) *Attorney, Agent, or Firm* — Birch, Stewart, Kolasch & Birch, LLP

(57) ABSTRACT

A semiconductor structure includes a substrate, a dielectric layer, a first conductive feature and a second conductive feature. The substrate includes a semiconductor device. The dielectric layer is disposed on the substrate. The first conductive feature is formed in the first dielectric layer. The second conductive feature penetrates the first conductive feature and the dielectric layer, and is electrically connected to the first conductive feature and the semiconductor device.

20 Claims, 20 Drawing Sheets

(56) References Cited

U.S. PATENT DOCUMENTS

2014/0027822 A1\* 1/2014 Su .................... H01L 21/76895
                                                       438/653
2018/0182709 A1\* 6/2018 Jaywant ............ H01L 21/76814

\* cited by examiner

AA

BB

AA

BB

AA

BB

AA

BB

SEMICONDUCTOR STRUCTURE HAVING DEEP METAL LINE AND METHOD FOR FORMING THE SEMICONDUCTOR STRUCTURE

BACKGROUND

The semiconductor integrated circuit (IC) industry has over the past decades experienced tremendous advancements and is still experiencing vigorous development. With the dramatic advances in IC design, new generations of ICs have smaller and more complex circuits. Damascene process, such as single damascene or dual damascene, is one of the techniques used for forming BEOL (back-end-of-line) interconnect structures. The interconnect structures play an important role in miniaturization and electrical performance of the new generations of ICs. Thus, the industry pays much attention on development of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
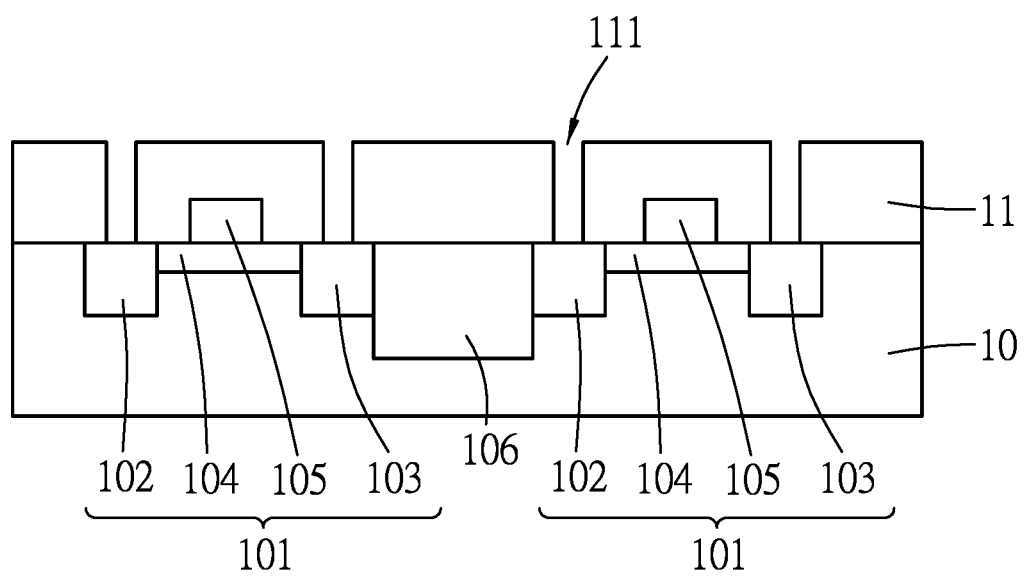
FIGS. 1 through 4 illustrate schematic views of stages in the formation of a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 4 illustrate schematic views of steps in the formation of a semiconductor structure.

Figure 2:
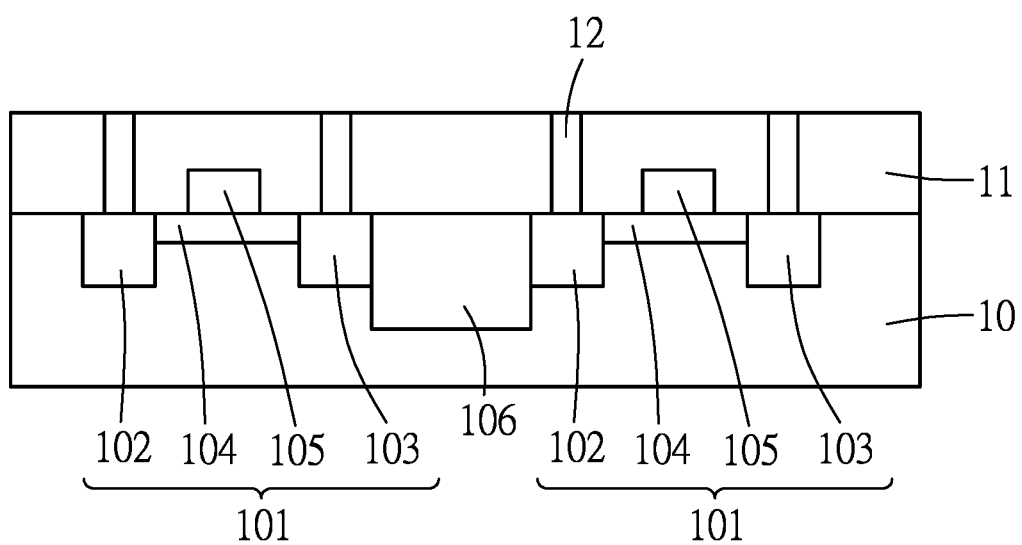
Figure 3:
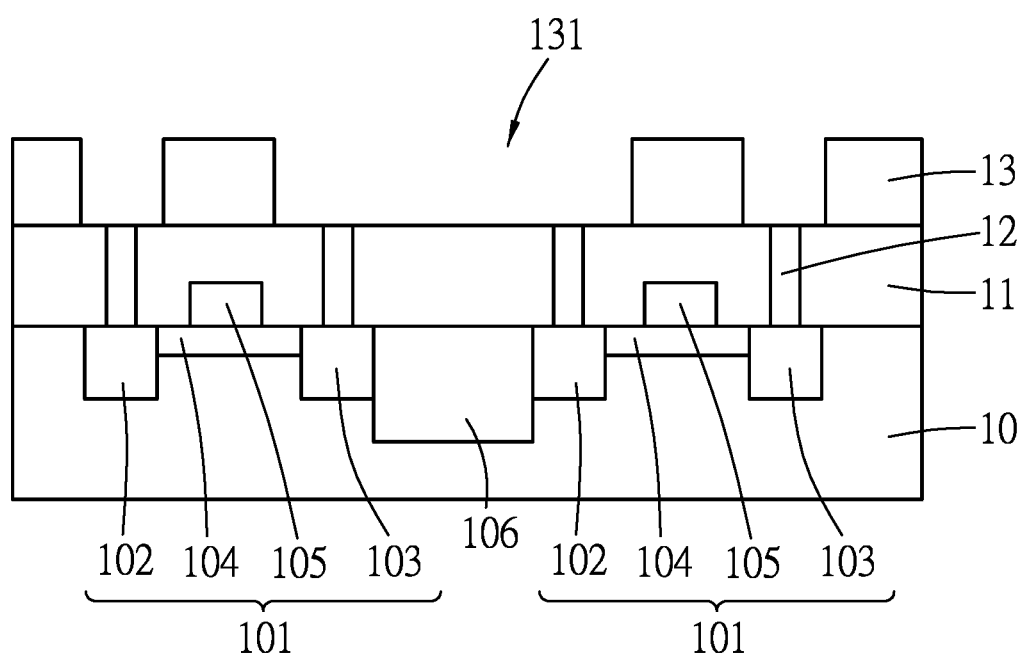
Figure 4:
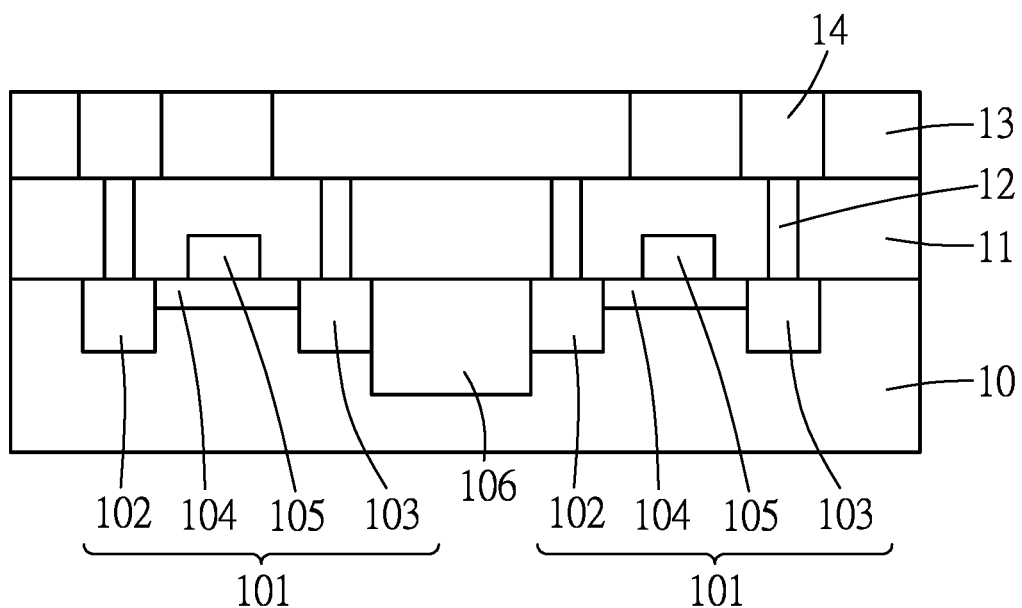

Referring to FIG. 1, a substrate 10 is provided, which is formed with a plurality of transistors 101 each including a source 102, a drain 103, a channel 104 connected between the source 102 and the drain 103, and a gate 105. The transistors 101 may be separated by an isolation feature 106, such as a shallow trench isolation (STI) or the like. A first dielectric layer 11 is then formed on the substrate 10, followed by patterning the first dielectric layer 11 to form a through hole 111 to expose at least one of the source 102, the drain 103, and the gate 105 of at least one of the transistors 101. Referring to FIG. 2, after the formation and patterning of the first dielectric layer 11, a conductive material is deposited by suitable deposition techniques, such as chemical vapor deposition (CVD) of the like, on the first dielectric layer 11 and in the through hole 111 (see FIG. 1) to fill the through hole 111, followed by performing a suitable planarization technique, such as chemical mechanical polishing (CMP) or the like to thin the deposited conductive material to form a contact plug 12 in the through hole 111 (see FIG. 1). Referring to FIG. 3, after the formation of the contact plug 12, a second dielectric layer 13 is formed on the first dielectric layer 11, followed by patterning the second dielectric layer 13 to form a through hole 131 to expose the contact plug 12. In the case where multiple through holes 111 are formed in the first dielectric layer 11 and multiple contact plugs 12 are subsequently formed in these through holes 111, the through hole 131 that is formed by patterning the second dielectric layer 13 may expose one or more of the contact plugs 12. Referring to FIG. 4, after the formation and patterning of the second dielectric layer 13, a conductive material is deposited on the second dielectric layer 13 to fill the through hole 131 (see FIG. 3) by suitable deposition techniques, such as physical vapor deposition (PVD) or the like, followed by performing a suitable planarization technique, such as CMP or the like to thin the deposited conductive material to form a conducting line 14.

Figure 5:
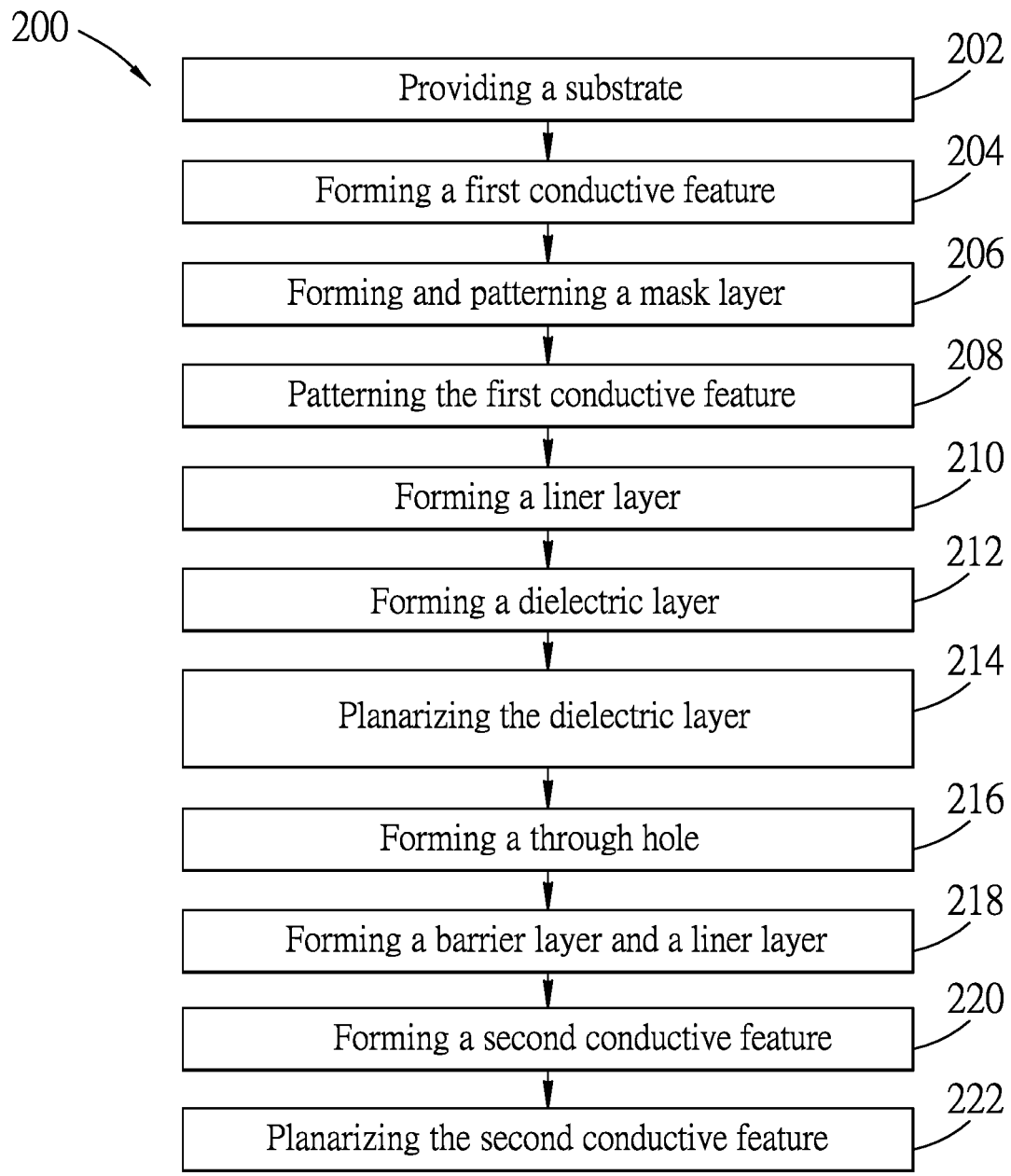
FIG. 5 illustrates a process flow for making a semiconductor structure in accordance with some embodiments.
Figure 6:
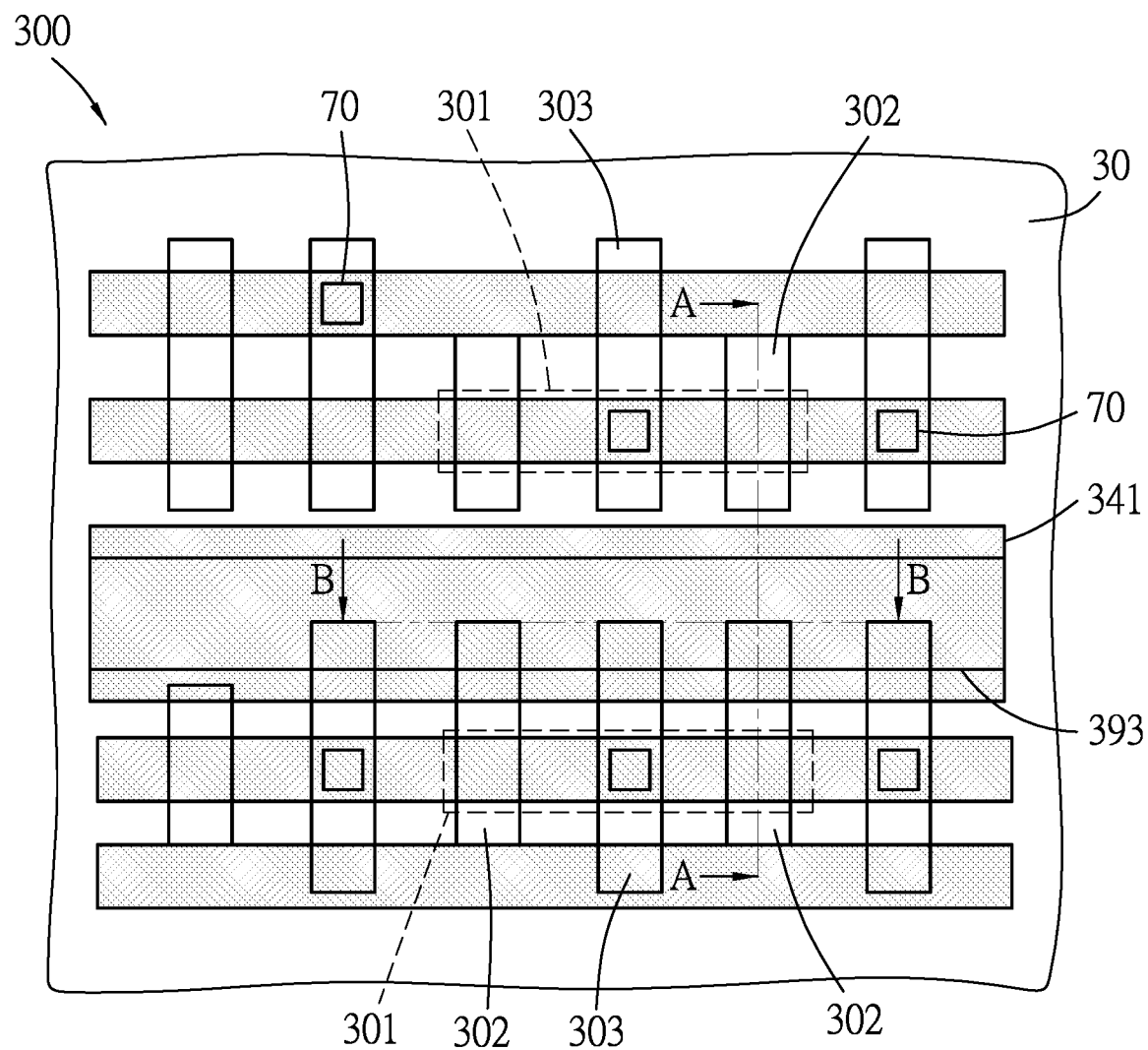
FIG. 6 illustrates a layout of a semiconductor structure in accordance with some embodiments.

FIG. 6 schematically illustrates a layout of a semiconductor structure 300, which includes a plurality of semiconductor devices (e.g., transistors 301), each of which includes at least two MD structures 302 and a MG structure 303. In some embodiments, MD refers to metal on OD (oxide-defining region), which may be connected to source or drain regions of one transistor 301 (not shown). In some embodiments, MG refers to metal gate, which may be made of metal or polysilicon and is a part of a gate structure of one transistor 301. FIGS. 7 to 16 illustrate schematic views of intermediate steps in the formation of the semiconductor structure 300 in accordance with some embodiments. Each of FIGS. 7 to 16 shows two schematic sectional views respectively taken from lines AA and BB of FIG. 6 during manufacturing of the semiconductor structure 300. The corresponding processes are also reflected in the flow chart 200 as shown in FIG. 5.

Figure 7:
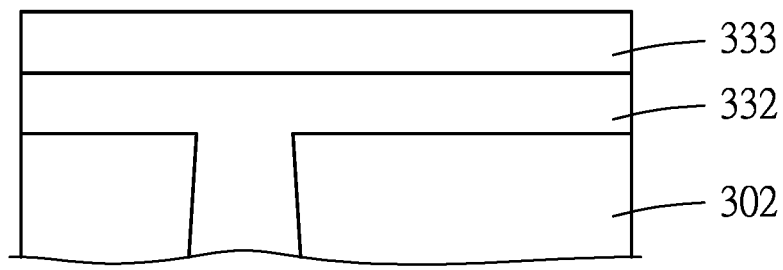
FIGS. 7 through 16 illustrate schematic views of stages in the formation of a semiconductor structure in accordance with some embodiments.
Figure 7:
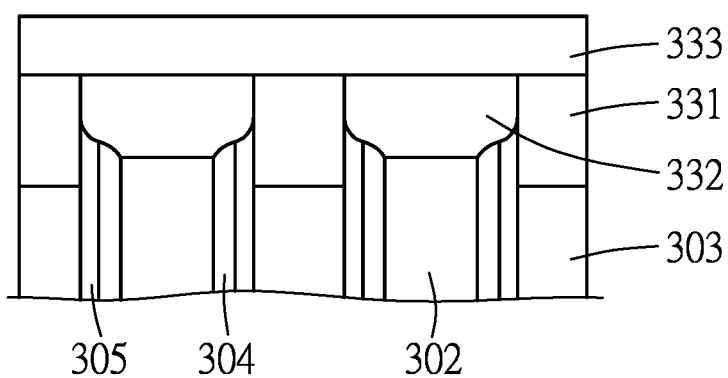

Referring to FIGS. 6 and 7, in accordance with some embodiments, a substrate 30 is provided. This process is illustrated as process 202 in the flow chart 200 shown in FIG. 5. In some embodiments, the transistors 301 are formed partly in the substrate 30. In some embodiments, each of the transistors 301 may be a complementary metal-oxide semiconductor (CMOS) transistor, a planar or vertical multi-gate transistor (e.g., a FinFET device), a gate-all-around (GAA) device, a memory device (e.g., a NAND flash, a NOR flash, or the like) or the like, based on practical applications. In some embodiments, the substrate 30 may be a semiconductor substrate, e.g., an elemental semiconductor or a compound semiconductor. An elemental semiconductor is composed of single species of atoms, such as silicon (Si) and germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 30 may include a multi-layer compound semiconductor structure. Alternatively, the substrate 30 may include a non-semiconductor material, such as a glass, fused quartz, or calcium fluoride. Furthermore, in some embodiments, the substrate 30 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 30 may be doped with a p-type dopant, such as boron (Br), aluminum (Al), gallium (Ga), or the like, or may alternatively be doped with an n-type dopant, as is known in the art. In some embodiments, the substrate 30 may include a doped epitaxial layer. Shallow trench isolation (STI) regions (not shown) may be formed in the substrate 30 to isolate active regions in the substrate 30. In addition, through-vias (not shown) may be formed to extend into the substrate 30 for electrically connecting features on opposite sides of the substrate 30.

In accordance with some embodiments, top portions of the source and drain regions and the MG structure 303 of each of the transistors 301 may be formed with a silicide feature (not shown) to improve electrical connection with subsequently formed electrical connection features. In some embodiments, the silicide feature may include cobalt silicide, titanium silicide, tungsten silicide, nickel silicide, molybdenum silicide, tantalum silicide, platinum silicide, palladium silicide, or the like. In some embodiments, the MD structures 302 and the MG structures 303 may be separated by a plurality of spacers 304, 305 made of suitable materials, such as silicon nitride, silicon oxide or the like. In some embodiments, the spaces 304 and 305 may be made of different materials.

In accordance with some embodiments, the MG structure 303 of each of the transistors 301 may be covered with a first dielectric layer 331 (may be referred to as a first self-aligned contact (SAC) dielectric or SAC1 layer), and the MD structure 302 of each of the transistors 301 may be covered with a second dielectric layer 332 (may be referred to as a second self-aligned contact (SAC) dielectric or SAC2 layer). In some embodiments, the first and second dielectric layers 331, 332 may be covered with a third dielectric layer 333 (may be referred to as an interlayer dielectric (ILD 2) layer). Each of the first, second and third dielectric layers 331, 332, 333 may include multiple sub-layers (not shown), and may be made of a suitable dielectric material, such as silicon oxide, silicon nitride, silicon carbide (including undoped silicon carbide (UDC), oxygen-doped silicon carbide (ODC), nitrogen-doped silicon carbide (NDC), or the like), silicon oxynitride, silicon oxycarbide (including SiOCH), silicon carbonitride, silicon oxycarbide nitride, aluminum oxide, aluminum oxynitride, aluminum nitride, zirconium oxide, zirconium aluminum oxynitride, amorphous silicon or combinations thereof. In some embodiments, silicon oxide may be made from tetraethyl orthosilicate (TEOS). In some embodiments, the first, second and third dielectric layers 331, 332, 333 may be made of different materials. Each of the first, second and third dielectric layers 331, 332, 333 may be formed by any suitable process including CVD (e.g., flowable CVD (FCVD), low pressure CVD (LPCVD), plasma enhanced CVD (PECVD), or the like), PVD, ALD, spin-on coating, and/or other suitable techniques, and may be formed to have any suitable thickness.

Figure 8:
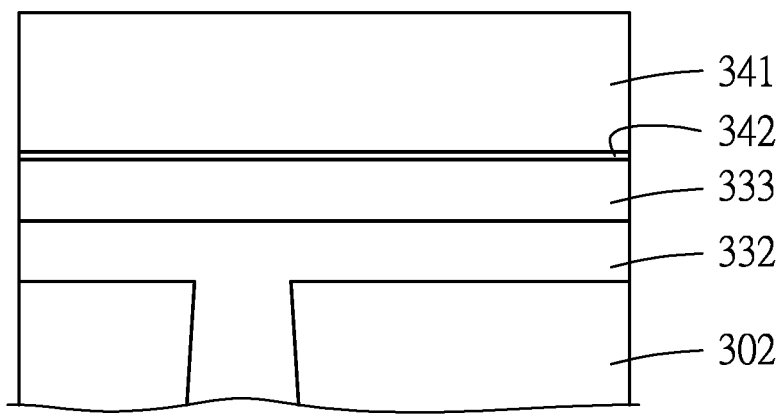
Figure 8:
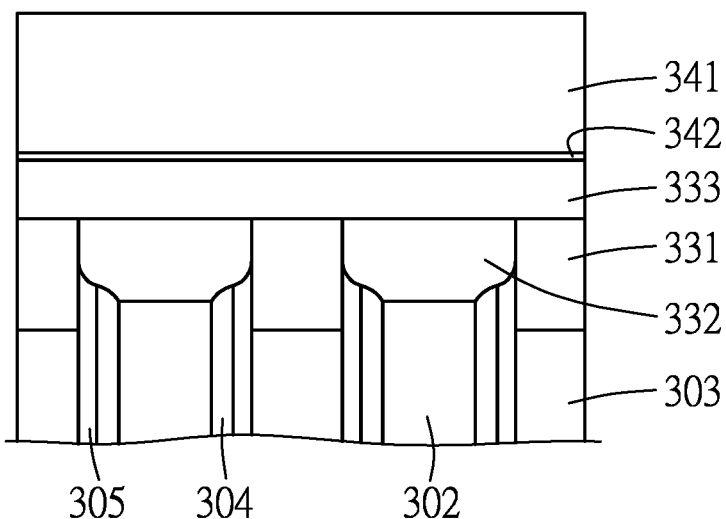

Referring to FIGS. 6 and 8, in accordance with some embodiments, a first conductive feature 341 is formed on the third dielectric layer 333. This process is illustrated as process 204 in the flow chart 200 shown in FIG. 5. In some embodiments, prior to the formation of the first conductive feature 341, a glue layer 342 may be formed on the third dielectric layer 333, and may include tantalum, tantalum nitride, cobalt, ruthenium, titanium, titanium nitride, manganese nitride, tungsten, aluminum, molybdenum, iridium, rhodium, graphene, conductive self-assembled monolayer, or the like. The glue layer 342 may be deposited using suitable techniques, such as PVD, CVD, atomic layer deposition (ALD), or the like. In some embodiments, the first conductive feature 341 is a metal layer, and may be made of copper, ruthenium, tungsten, titanium, aluminum, cobalt, molybdenum, iridium, rhodium, cobalt-tungsten-phosphorus, combinations thereof, or the like. In some embodiments, the first conductive feature 341 may be formed by suitable techniques, such as PVD, CVD, ALD, electroless deposition (ELD), a combination of PVD and electrochemical plating (ECP), or the like.

Figure 9:
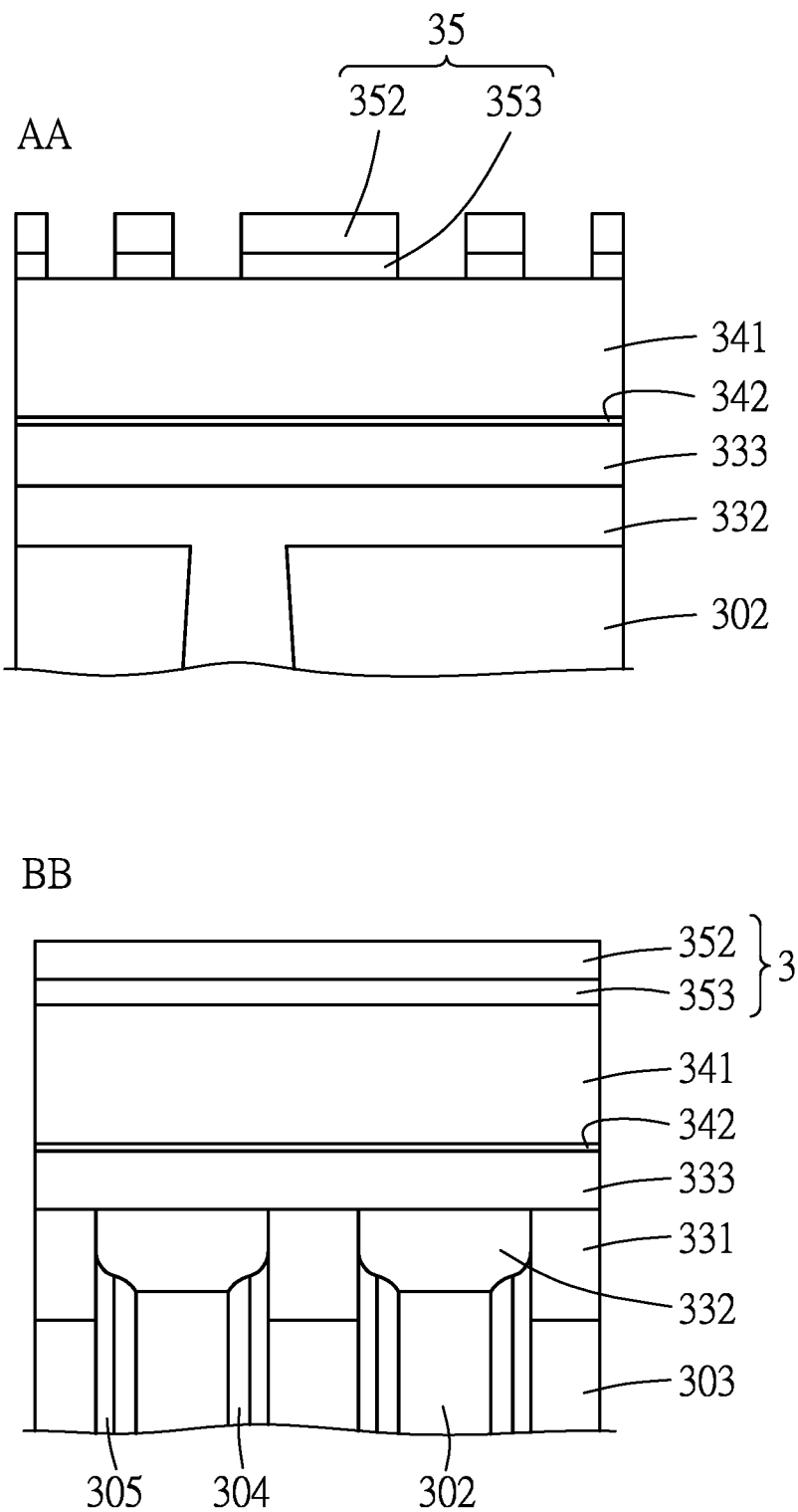

Referring to FIG. 9, after the formation of the glue layer 342 and the first conductive feature 341, a mask layer 35 is formed on the first conductive feature 341. Afterwards, the mask layer 35 is patterned into a desired shape. This process is illustrated as process 206 in the flow chart 200 shown in FIG. 5. In some embodiments, the mask layer 35 may have a thickness ranging from about 50 Å to about 400 Å. In accordance with some embodiments, the mask layer 35 may include multiple sub-layers (e.g., first sub-layer 352 and second sub-layer 353) each being made of a suitable material, such as titanium nitride, silicon oxide, silicon nitride, silicon oxynitride, silicon oxycarbide (including SiOCH), tungsten carbide, tantalum nitride, silicon (e.g., amorphous silicon), silicon carbide nitride, silicon carbide (including UDC, ODC, NDC or the like), or combinations thereof. In some embodiments, the first sub-layer 352 may be made of silicon nitride, and the second sub-layer 353 may be made of titanium nitride. The mask layer 35 may be formed using a suitable technique, such as spin-on coating, CVD (e.g., FCVD, LPCVD, PECVD, or the like), ALD, or the like.

In accordance with some embodiments, a photoresist (not shown) may be used for patterning the mask layer 35. The photoresist is first formed on the mask layer 35, and is then patterned using a patterned mask. The photoresist may include a photosensitive material which undergoes a property change when exposed to light. The property change may be used to selectively remove exposed or unexposed portions of the photoresist in a photolithographic patterning process. In some embodiments, a photolithographic system exposes the photoresist to radiation. Radiation light passing through the patterned mask strikes the photoresist to thereby transfer a layout of the patterned mask to the photoresist. In some embodiments, the photoresist is patterned using a direct writing or maskless lithographic technique, such as laser patterning, e-beam patterning, ion-beam patterning, or the like. After the exposure step, the photoresist is then developed, leaving the exposed portions of the photoresist, or in alternative examples, leaving the unexposed portions of the photoresist. In some embodiments, the patterning process may include multiple steps, such as soft baking of the photoresist, mask alignment, exposure, post-exposure baking, developing of the photoresist, rinsing, and drying (e.g., hard baking). Each of the steps may be repeated or omitted according to practical requirements. The patterned photoresist exposes portions of the mask layer 35 to be etched. In some embodiments, the etching process may include an anisotropic (i.e., directional) etching configured to etch vertically through the mask layer 35 without substantial horizontal etching. Accordingly, the etching process may include any suitable etching technique, such as dry etching, wet etching, reactive ion etching (RIE), ashing, or the like. The etching process may use any suitable etchant, and the particular etchant or etchants may depend on the materials of the mask layer 35 being used.

Figure 10:
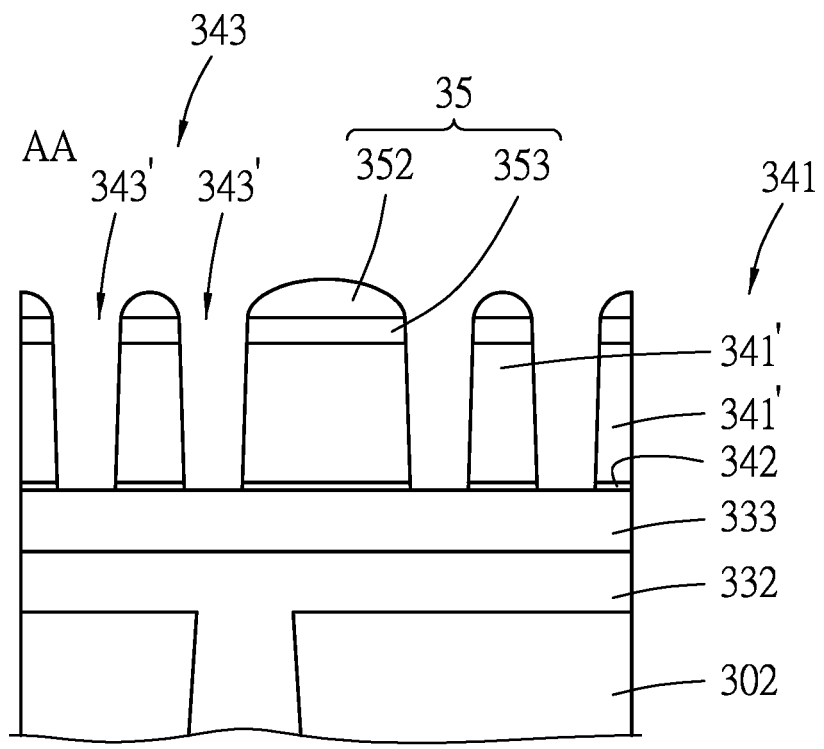
Figure 10:
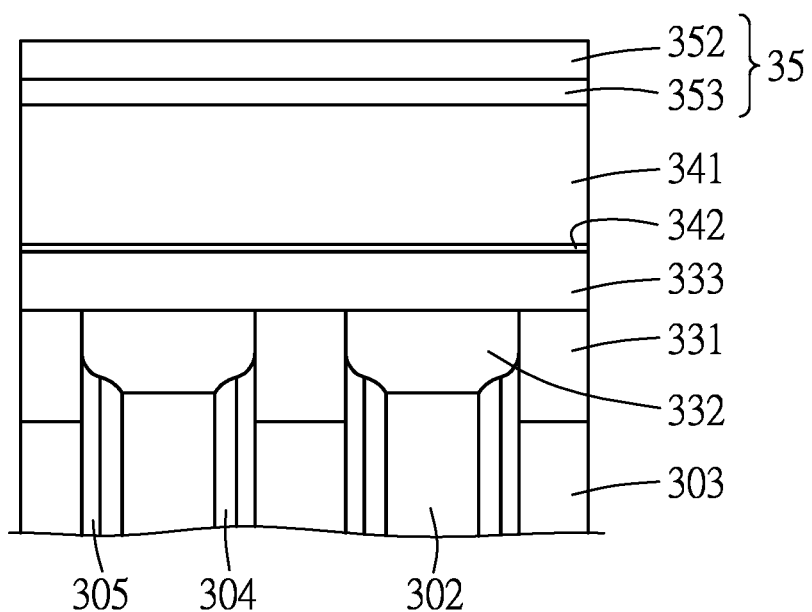

Referring to FIG. 10, after the mask layer 35 is formed and patterned, the first conductive feature 341 is patterned using the patterned mask layer 35 as a mask to form a through-hole structure 343. In accordance with some embodiments, the glue layer 342 is also patterned in this step. This process is illustrated as process 208 in the flow chart 200 shown in FIG. 5. The first conductive feature 341 may be patterned by suitable techniques, such as an oxidizing plasma containing chlorine or the like. In some embodiments, the glue layer 342 or the third dielectric layer 333 may serve as an etch stop layer for the etching of the first conductive feature 341.

Figure 11:
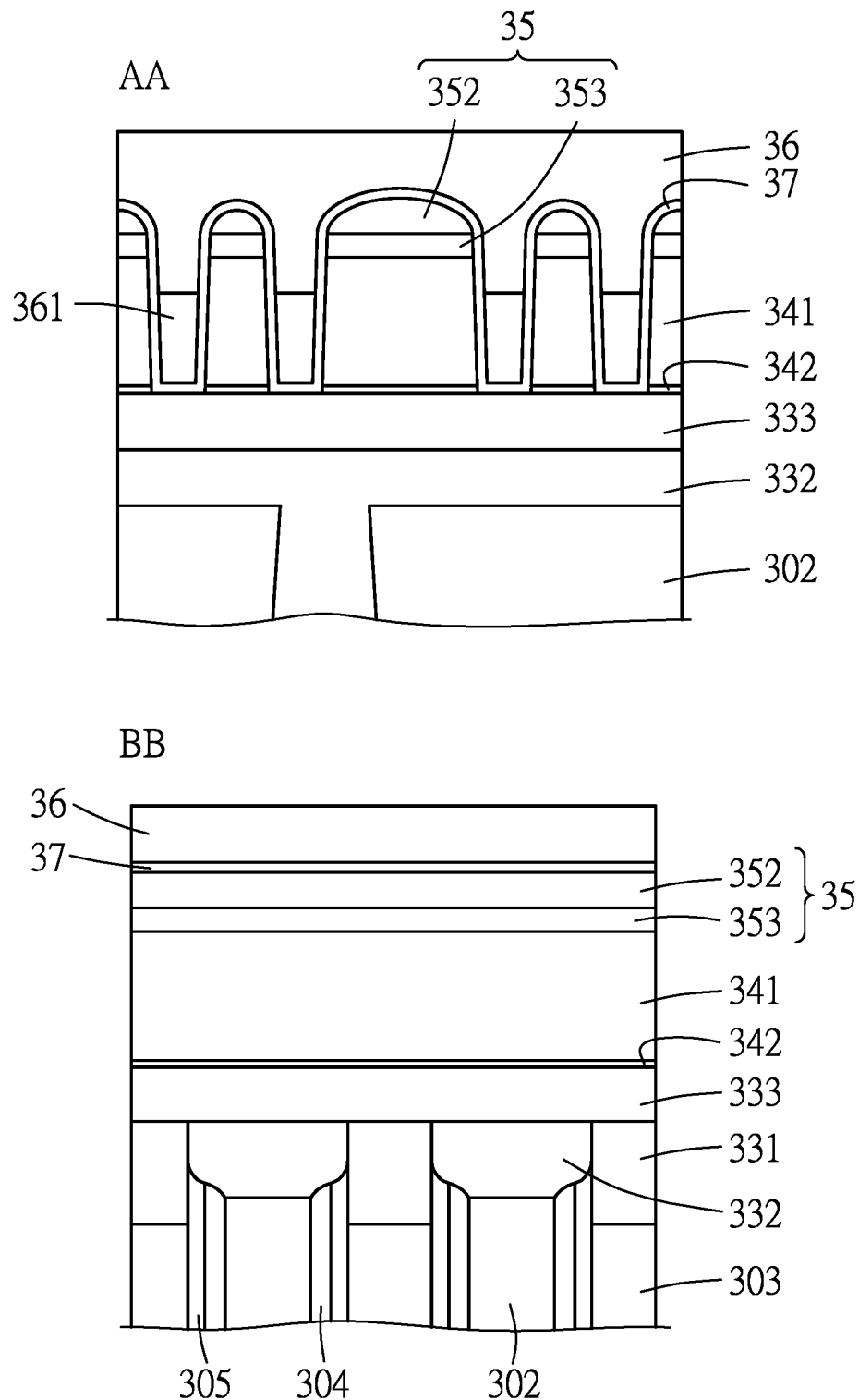

Referring to FIG. 11, after the first conductive feature 341 is patterned, a fourth dielectric layer 36 is formed over the mask layer 35 and fills the through-hole structure 343 (see FIG. 10). This process is illustrated as process 212 in the flow chart 200 shown in FIG. 5. In some embodiments, an air gap 361 may be formed and may be adjacent to or adjoin the first conductive feature 341. In some embodiments, the air gap 361 may be defined by the second dielectric layer 36, the first conductive feature 341 and the third dielectric layer 333. The fourth dielectric layer 36 is made of a suitable dielectric material, such as silicon oxide, silicon nitride, silicon carbide (including UDC, ODC, NDC, or the like), silicon oxynitride, silicon oxycarbide, silicon carbide nitride (including SiOCH), silicon oxycarbide nitride, aluminum oxide, aluminum oxynitride, aluminum nitride, zirconium oxide, zirconium aluminum oxynitride, amorphous silicon or combinations thereof. In some embodiments, silicon dioxide may be made from TEOS. The dielectric layer 36 may be formed using a suitable technique, such as spin-on coating, CVD (e.g., FCVD, LPCVD, PECVD, or the like), ALD, or the like.

In accordance with some embodiments, prior to the formation of the dielectric layer 36, a barrier/liner layer 37 may be conformally formed to cover the patterned mask layer 35 and surround the through-hole structure 343 (see FIG. 10). This process is illustrated as process 210 in the flow chart 200 shown in FIG. 5. In some embodiments, the barrier/liner layer 37 is made of suitable oxide materials, ODC, silicon nitride (e.g., silicon carbonitride), aluminum oxide, aluminum nitride, or the like, and may be formed by a suitable technique, such as CVD (e.g., FCVD, LPCVD, PECVD, or the like), ALD (including plasma enhanced ALD (PEALD)), or the like.

Figure 12:
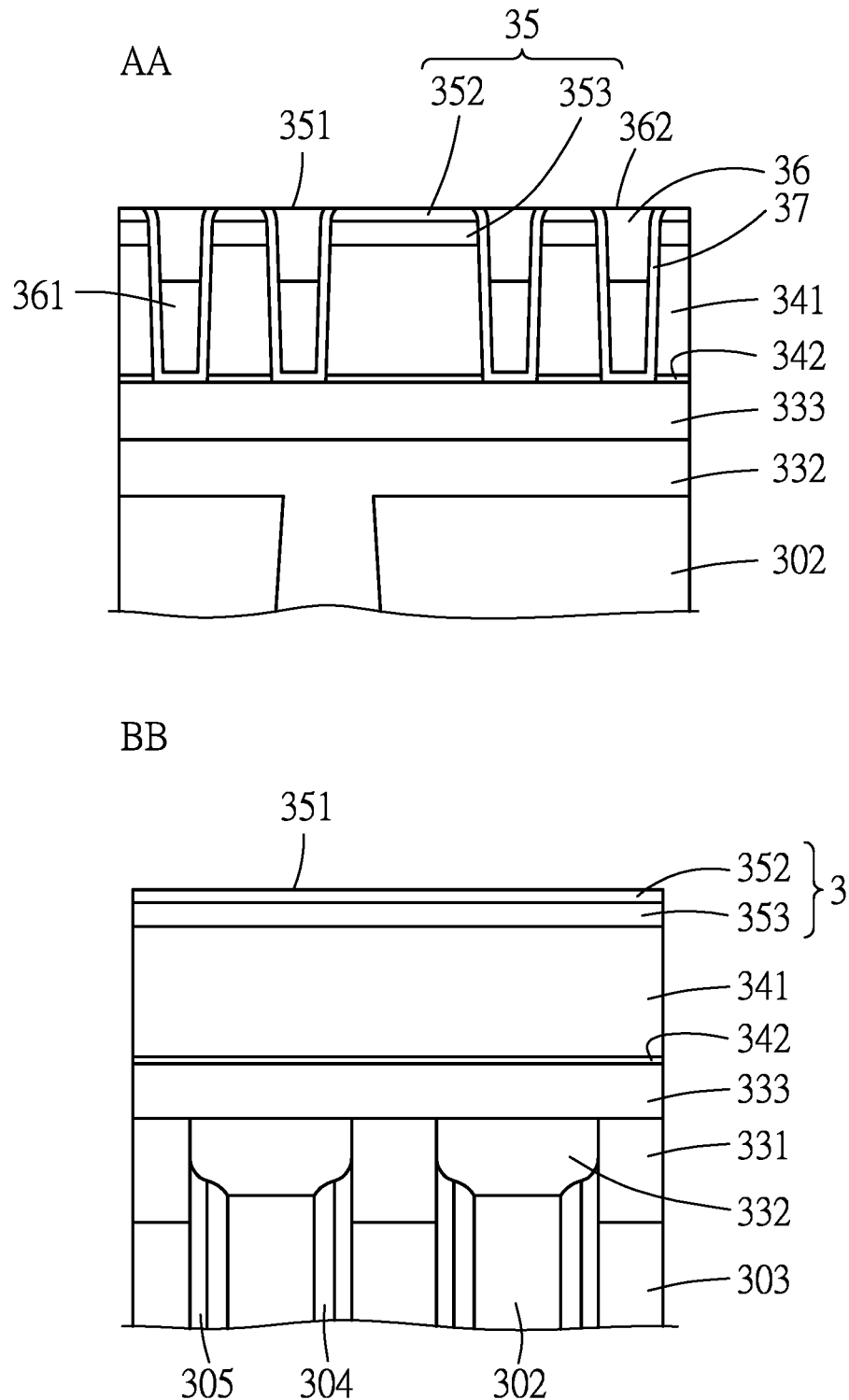

Referring to FIG. 12, after the formation of the dielectric layer 36, the dielectric layer 36 and the barrier/liner layer 37 are subjected to a suitable planarization process, such as plasma dry etching, CMP or the like. This process is illustrated as process 214 in the flow chart 200 shown in FIG. 5. In some embodiments, a part of the dielectric layer 36 and a part of the barrier/liner layer 37 formed on a top surface 351 of the patterned mask layer 35 are removed. In some embodiments, a portion of the first sub-layer 352 of the patterned mask layer 35 is also removed. In some embodiments, the first sub-layer 352 may be completely removed, and a portion of the second sub-layer 353 may be removed.

Figure 13:
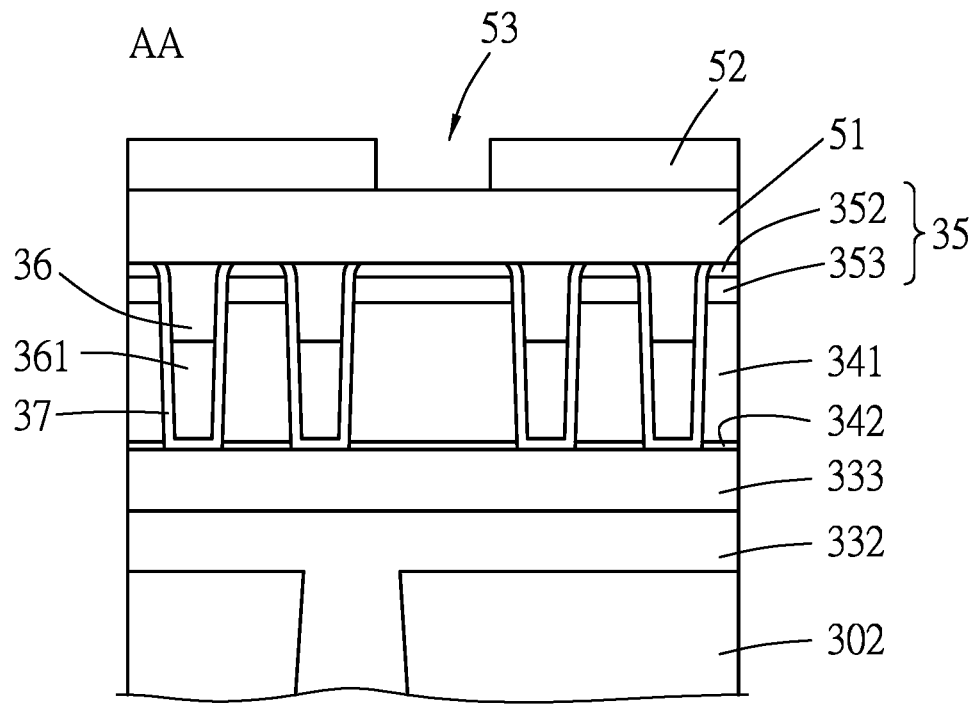
Figure 13:
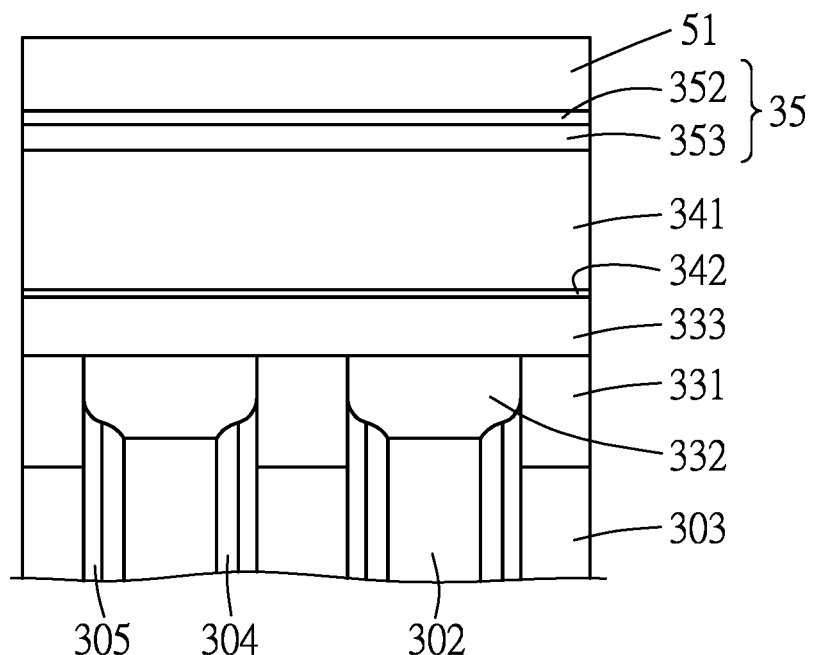

Referring to FIG. 13, after the planarization process, a photoresist 52 is formed over the patterned mask layer 35. In some embodiments, a middle layer (ML) and a bottom layer (BL), which are collectively denoted by numeral 51 in FIG. 13, may be formed over the patterned mask layer 35 before the formation of the photoresist 52. In some embodiments, the middle layer may be a silicon-containing anti-reflective coating (SiARC), such as $SiC_xH_yO_z$ or the like, and the bottom layer may be an optical planarization layer, such as $C_xH_yO_z$ or the like. After the formation of the photoresist 52 and the middle and bottom layers 51, the photoresist 52 may be patterned to form an opening 53.

Figure 14:
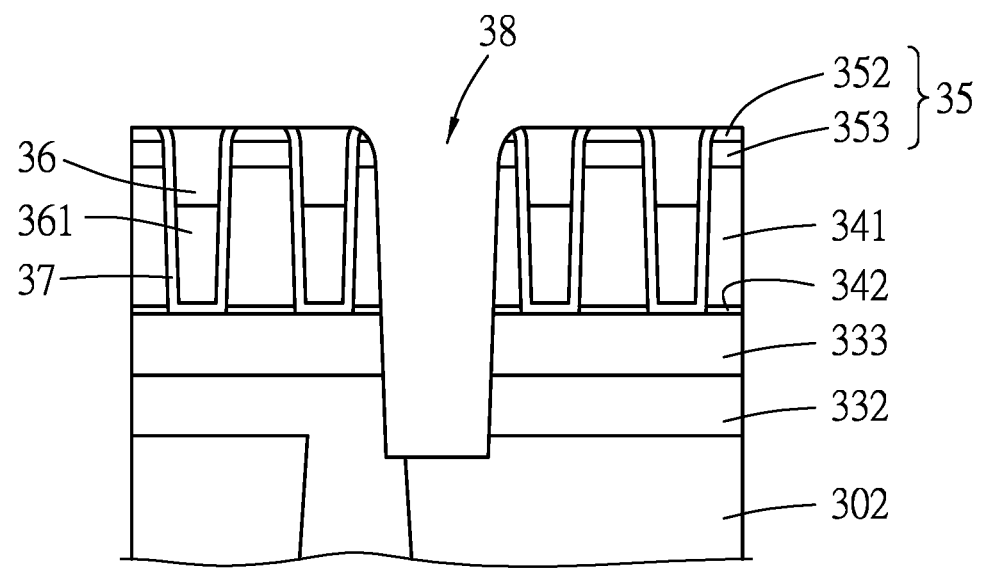
Figure 14:
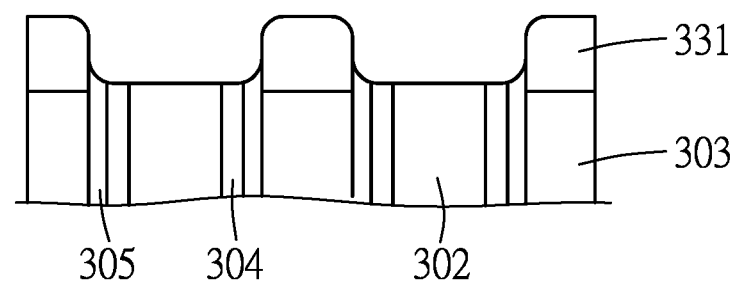

Referring to FIG. 14, after the process illustrated in FIG. 13, a through hole 38 is formed to penetrate the patterned mask layer 35, the first conductive feature 341, the glue layer 342, the third dielectric layer 333 and the second dielectric layer 332 to expose the MD structure 302 of a corresponding transistor 301 (see FIG. 6). The processes illustrated by FIGS. 13 and 14 are collectively illustrated as process 216 in the flow chart 200 shown in FIG. 5. The formation of the through hole 38 may be conducted by any suitable etching techniques, such as capacitively coupled plasma (CCP), inductively coupled plasma (ICP), transformer coupled plasma (TCP), or the like. In some embodiments, the first dielectric layer 331 and the second dielectric layer 332 may be made of different materials to have different etch selectively so that, in the etching process, the first dielectric layer 331 is etched through while the second dielectric layer 332 remains substantially unetched or only slightly etched. In some embodiments, the first dielectric layer 331 is made of silicon oxide, the second dielectric layer 332 is made of silicon nitride, and the etch rate of silicon oxide to silicon nitride may be greater than 10. In some embodiments, the MD structure 302 may be slightly etched during the formation of the through hole 38.

Figure 15:
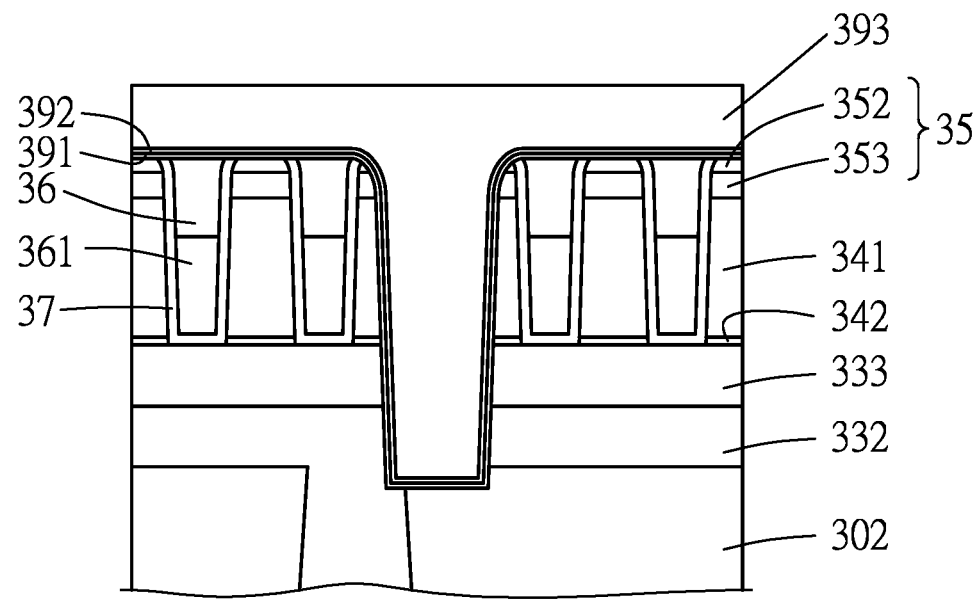
Figure 15:
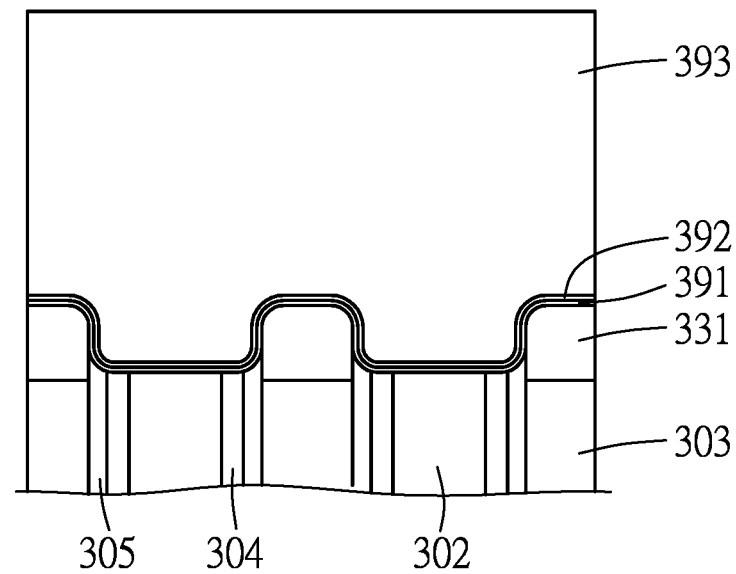

Referring to FIG. 15, after the formation of the through hole 38, a barrier layer 391 is formed, followed by forming a liner layer 392 on the barrier layer 391. This process is illustrated as process 218 in the flow chart 200 shown in FIG. 5. In some embodiments, the barrier layer 391 is formed on the top surface 351 of the patterned mask layer 35 (see FIG. 12) and a top surface 362 of the patterned dielectric layer 36 (see FIG. 12), and to surround the through hole 38 (see FIG. 14). In some embodiments, each of the barrier layer 391 and the liner layer 392 is made of an electrically conductive material including tantalum, tantalum nitride, cobalt, ruthenium, titanium, titanium nitride, manganese nitride, or combinations thereof. Each of the barrier layer 391 and the liner layer 392 may be formed by a suitable technique, such as CVD (e.g., FCVD, LPCVD, PECVD, or the like), ALD (including PEALD), or the like.

After the formation of the barrier layer 391 and the liner layer 392, a second conductive feature 393 is formed over the liner layer 392. This process is illustrated as process 220 in the flow chart 200 shown in FIG. 5. In some embodiments, the second conductive feature 393 is a metal layer, and may be made of a material including copper, ruthenium, tungsten, titanium, aluminum, cobalt, molybdenum, iridium, rhodium, cobalt-tungsten-phosphorus or combinations thereof. In some embodiments, the second conductive feature 393 may be formed by suitable techniques, such as PVD, CVD, ALD, ELD, a combination of PVD and ECP, or the like. In some embodiments, the second conductive feature 393 is electrically connected to the MD structure 302 of a corresponding transistor 301 (see FIG. 6).

Figure 16:
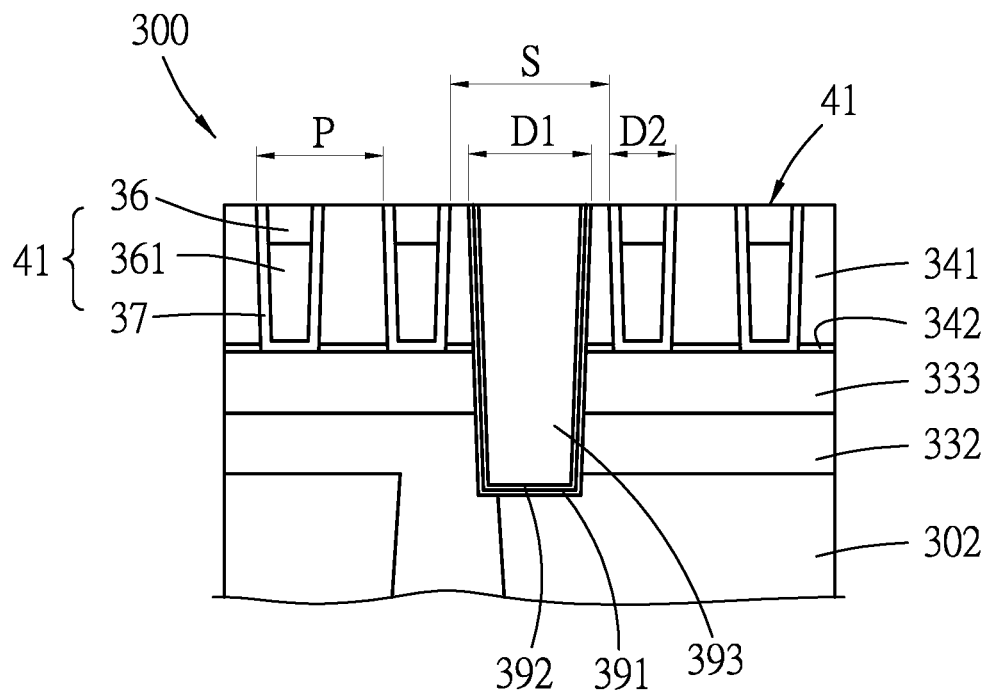
Figure 16:
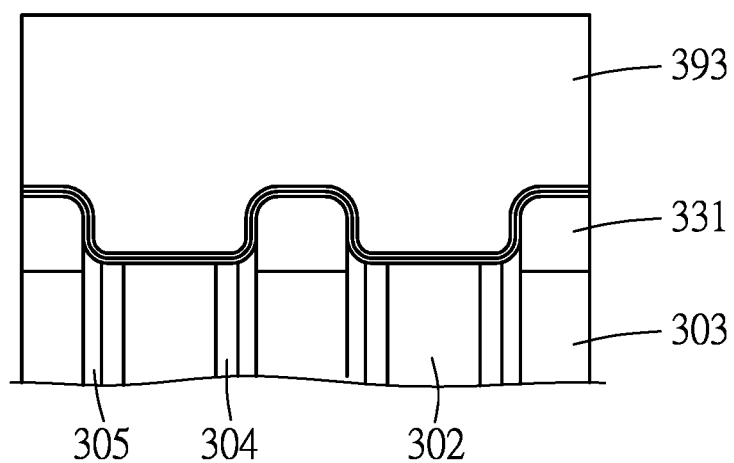

Referring to FIG. 16, after the formation of the second conductive feature 393, the second conductive feature 393 is planarized by suitable techniques, such as plasma dry etching, CMP or the like. This process is illustrated as process 222 in the flow chart 200 shown in FIG. 5. In some embodiments, a part of the second conductive feature 393, a part of the barrier layer 391 and the liner layer 392, a part of the fourth dielectric layer 36, a part of the barrier/liner layer 37 and the patterned mask layer 35 are removed to obtain the semiconductor structure 300. In some embodiments, the liner layer 392 surrounds and is connected to the second conductive feature 393, the barrier layer 391 surrounds and is connected to the liner layer 392, and the second conductive feature 393 is connected to the first conductive feature 341 through the liner layer 392 and the barrier layer 391. In some embodiments, according to practical applications, the first conductive feature 341 and the second conductive feature 393 may be made of the same or different materials. As shown in FIG. 16, in some embodiments, the second conductive feature 393 may partially land on the MD structure 302 of the corresponding transistor 301 (see FIG. 6). In other embodiments, the second conductive feature 393 may completely land on the MD structure 302 of the corresponding transistor 301. In some embodiments, the second conductive feature 393 formed in the through hole 38 (see FIG. 14) may correspond to the opening 53 formed in the photoresist 52. In some embodiments, top view of the second conductive feature 393 is as shown in FIG. 6.

In some embodiments, the semiconductor structure 300 may be subjected to subsequent interconnect formation processes, such as single or dual damascene processes to form multiple interconnect layers above the semiconductor structure 300 to realize desired electric connection for the semiconductor structure 300. Referring to FIG. 6, in accordance with some embodiments, the MG structure 303 of a corresponding transistor 301 may be electrically connected to the first conductive feature 341 through a electrical connection structure, such as a via 70.

Figure 17:
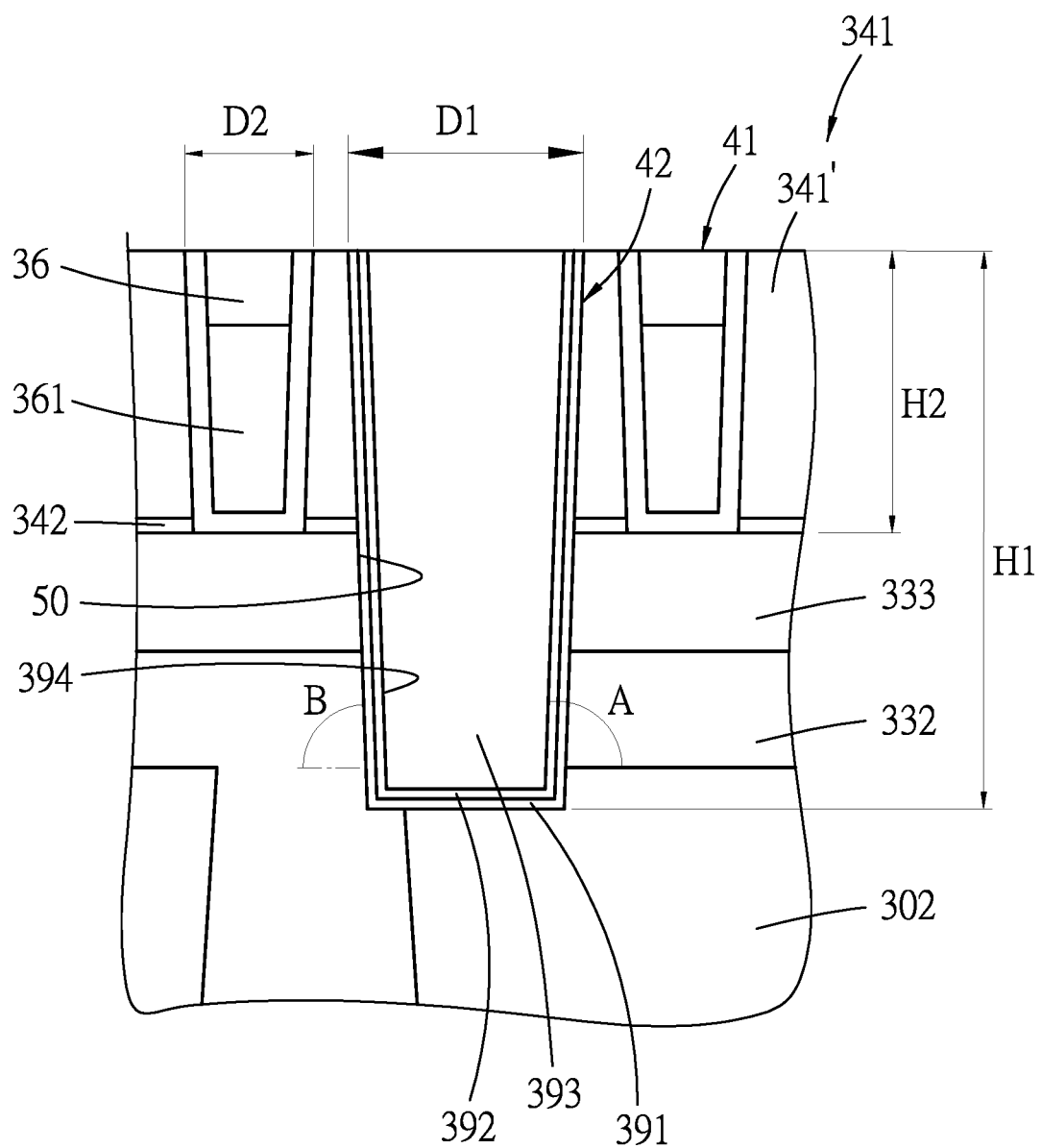
FIG. 17 is an enlarged sectional view of a semiconductor structure in accordance with some embodiments.

Referring to FIGS. 6, 16 and 17, in some embodiments, the through-hole structure 343 includes a plurality of through holes 343' (see FIG. 10) which divide the first conductive feature 341 into a plurality of conductive components 341'. The second conductive feature 393 penetrates a corresponding one of the conductive components 341'. In some embodiments, after obtaining the semiconductor structure 300, the patterned dielectric layer 36, the barrier/liner layer 37 and the air gap 361 cooperatively define an isolation feature 41. In some embodiments, a minimum pitch (P) between adjacent two isolation features 41 ranges from about 12 nm to about 42 nm. In some embodiments, an aspect ratio of the isolation feature 41, which is defined by a height (H2) of the isolation feature 41 over a maximum width (D2) of the isolation feature 41 in the sectional view shown in FIG. 16 taken from line AA of FIG. 6, may range from about 1 to about 4. In some embodiments, the height (H2) of the isolation feature 41 ranges from about 10 nm to about 35 nm. In some embodiments, the maximum width (D2) of the isolation feature 41 ranges from about 5 nm to about 20 nm. In some embodiments, a conductive feature 42 is defined to include the barrier layer 391, the liner layer 392 and the second conductive feature 393. In some embodiments, a maximum width (D1) of the conductive feature 42 in the sectional view shown in FIGS. 16 and 17 taken from line AA of FIG. 6 may range from about 10 nm to about 100 nm. In other embodiments, the maximum width (D1) of the conductive feature 42 may range from about 3 nm to about 20 nm. In some embodiments, the height (H1) of the conductive feature 42 may range from about 20 nm to about 100 nm. In some embodiments, an aspect ratio of the conductive feature 42, which is defined by the height (H1) of the conductive feature 42 over the maximum width (D1) of the conductive feature 42, may range from about 0.5 to about 5. In other embodiments, the aspect ratio of the conductive feature 42 may range from about 1 to about 10. In some embodiments, the second conductive feature 393 has an outer wall 394 that forms an included angle (A) with the MD structure 302 of the corresponding transistor 301 (see FIG. 6), and the included angle (A) may range from about 72 degrees to about 90 degrees. In some embodiments, the though hole 38 (see FIG. 14) is defined by a hole-defining wall 50, which is collaboratively defined by the first conductive feature 341, the glue layer 342, the second dielectric layer 332, the third dielectric layer 333 and the MD structure 302 of the corresponding transistor 301. The barrier layer 391 is conformally formed on the hole-defining wall 50. In some embodiments, the hole-defining wall 50 forms an included angle (B) with the MD structure 302 of the corresponding transistor 301, and the included angle (B) ranges from about 72 degrees to about 90 degrees, such that the second conductive feature 393 formed in the though hole 38, which is defined by the hole-defining wall 50, has the outer wall 394 forming the 72-to-90-degree included angle (A) with the MD structure 302 of the corresponding transistor 301.

Figure 18:
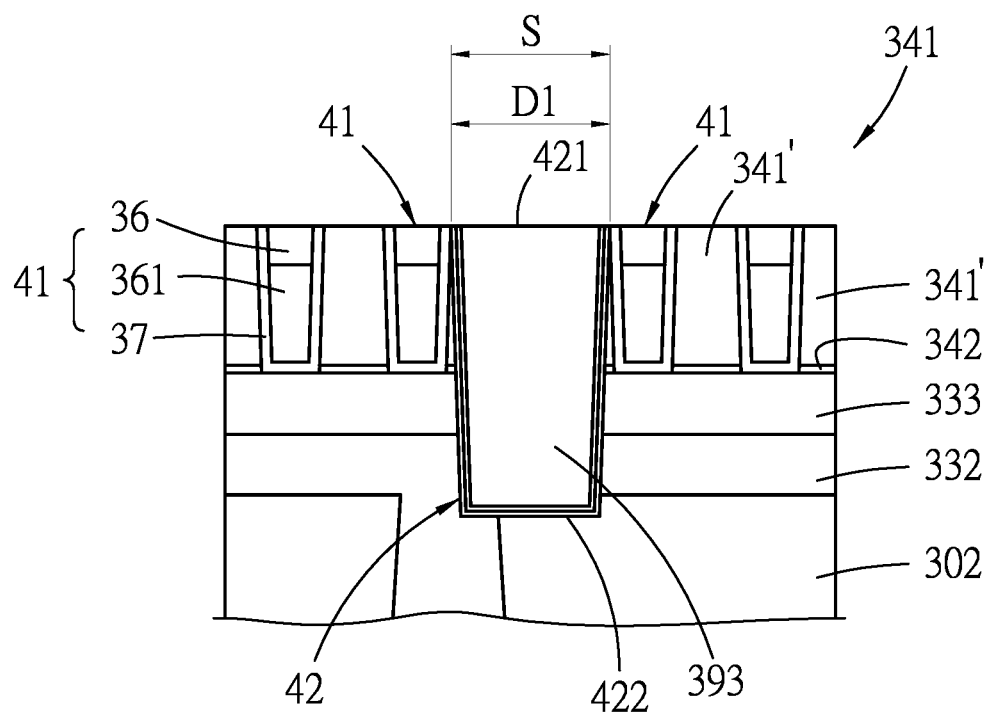
FIG. 18 illustrates an alternative to the structure depicted in FIG. 16.

Referring to FIG. 18, in some embodiments, the conductive feature 42 has a bottom surface 422 connected to the MD structure 302 of the transistor 301, and a top surface 421 opposite to the bottom surface 422 and substantially flush with a top surface of the corresponding one of the conductive components 341' of the first conductive feature 341 through which the conductive feature 42 penetrates. In some embodiments, the top surface 421 of the conductive feature 42 has an area accounting for about 20% to about 100% of an area of the top surface of the corresponding one of the conductive components 341' of the first conductive feature 341. FIG. 18 shows that, in some embodiments, the area of the top surface 421 of the conductive feature 42 accounts for 100% of the area of the top surface of the corresponding one of the conductive components 341' of the first conductive feature 341. In other words, the maximum width (D1) of the conductive feature 42 equals the minimum distance (S) between the isolation features 41 adjacent to the conductive feature 42. In some embodiment, for the conductive feature 42, the area of the top surface 421 may be equal to or larger than an area of the bottom surface 422.

Figure 19:
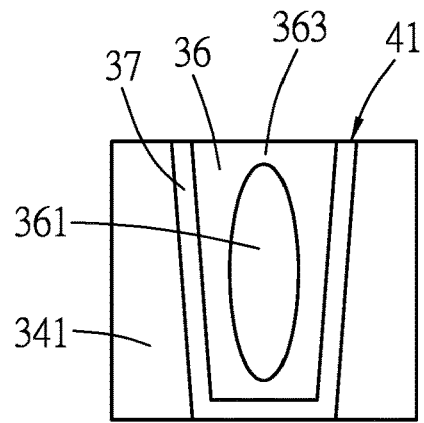
FIGS. 19 through 21 illustrate various examples of an isolation feature in accordance with some embodiments.
Figure 20:
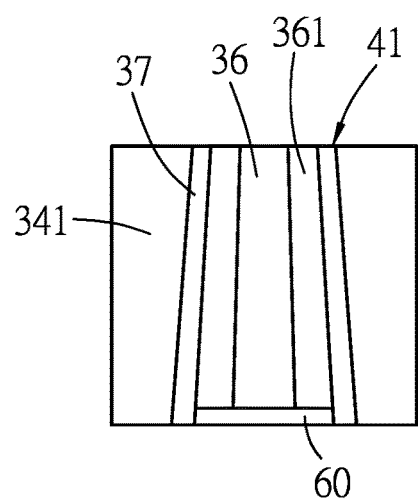
Figure 21:
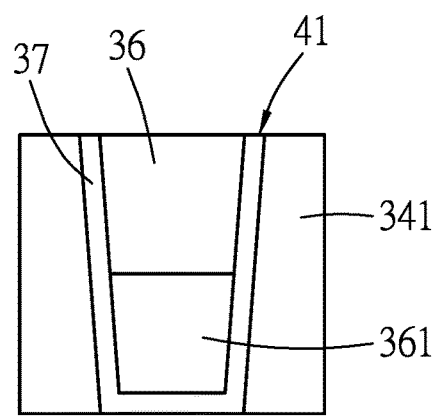

FIGS. 19 to 21 schematically show various examples of the air gap 361. In some embodiments, in one through hole 343' (see FIG. 10), the volume of the air gap 361 is about 20% to about 90% of the volume of the through hole 343', and the volume of the dielectric layer 36 is about 10% to about 80% of the volume of the through hole 343'. Referring to FIG. 19, in some embodiments, during formation of the dielectric layer 36, a top portion 363 of the dielectric layer 36 may seal the through hole 343' before the through hole 343' is completely filled with the dielectric layer 36, thereby leaving the air gap 361 in the through hole 343'.

Referring to FIG. 20, in some embodiments, a suitable etch stop layer 60 is formed at a bottom of the through hole 343' (see FIG. 10). In such embodiments, before forming the dielectric layer 36, the etch stop layer 60 is formed on the bottom of the through hole 343', followed by filling the through hole 343' with thermal degradable or UV degradable materials (not shown) to form a degradable element. The thermal or UV degradable materials may be made of polyurea-containing materials, acrylate-containing materials, carboxylate-containing materials, or the like. The thermal or UV degradable materials may be formed by suitable techniques, such as ALD (including PEALD), CVD (e.g., FCVD, LPCVD, PECVD, or the like), molecular layer deposition (MLD), spin-on coating, or the like. Then, the degradable element is etched (e.g., using anisotropic dry etching) all the way to the etch stop layer 60 to form a hollow space (not shown) in the degradable element, followed by filling the hollow space with the dielectric layer 36. Finally, the remainder of the thermal degradable or UV degradable materials are removed by thermal treatment or UV radiation to form the air gap 361. In some embodiments, the thermal treatment may be conducted under a temperature ranging from about 200° C. to about 400° C. for about 10 seconds to about 10 minutes. In some embodiments, the UV radiation may be conducted under a radiation energy ranging from about 10 mJ/cm$^2$ to about 100 J/cm$^2$ for about 10 seconds to about 10 minutes.

Referring to FIG. 21, in some embodiments, the thermal degradable or UV degradable materials are formed at a bottom portion of the through hole 343' (see FIG. 10), followed by completely filling the through hole 343' with the dielectric layer 36. Then, the thermal degradable or UV degradable materials are removed by suitable thermal treatment or UV radiation to form the air gap 361.

Figure 22:
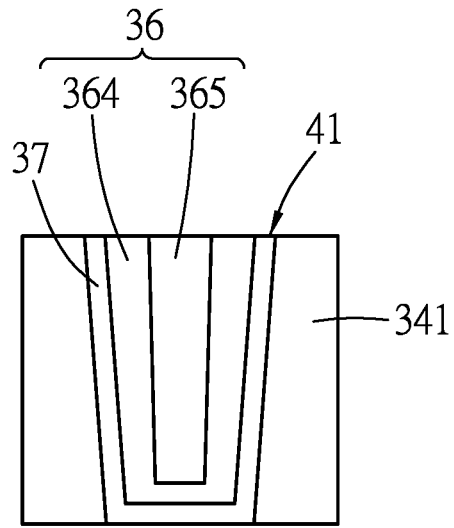
FIGS. 22 and 23 illustrate other examples of an isolation feature in accordance with some embodiments.

In some embodiments, the isolation feature 41 may not contain the air gap 361. Referring to FIG. 22, in some embodiments, the dielectric layer 36 may include a first sub-layer 364 and a second sub-layer 365. In some embodiments, the first sub-layer 364 is first formed in the through hole 343' (see FIG. 10), followed by forming the second sub-layer 365 to completely fill the through hole 343'.

Figure 23:
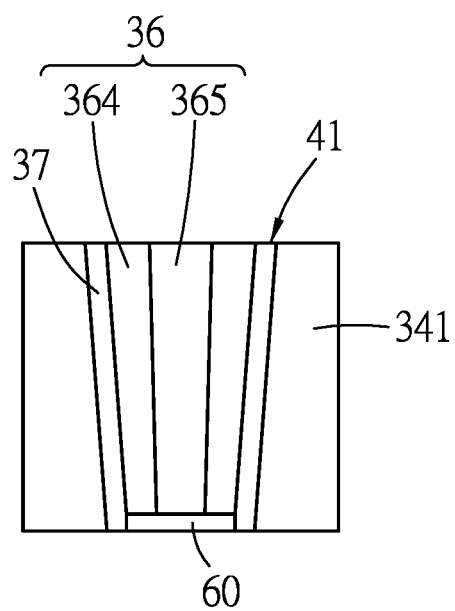

Referring to FIG. 23, in some embodiments, the etch stop layer 60 is formed at a bottom of the through hole 343' (see FIG. 10). Afterwards, the first sub-layer 364 is formed to fill the through hole 343', followed by etching (e.g., using anisotropic dry etching) the first sub-layer 364 all the way to the etch stop layer 60 to form a hollow space (not shown) within the first sub-layer 364. Then, the hollow space is filled with the second sub-layer 365.

The first sub-layer 364 and the second sub-layer 365 may be made of different dielectric materials according to practical requirements. In some embodiments, the first sub-layer 364 may be made of a material that has better adhesion to the barrier/liner layer 37 or the first conductive feature 341. In some embodiments, the second sub-layer 365 may be made of low-K dielectric materials. In some embodiments, the first sub-layer 364 may be made of nitride-doped silicon carbonate, and the second sub-layer 365 may be made of silicon oxide, silicon nitride, silicon carbide (including UDC, ODC, NDC, or the like), silicon oxynitride, silicon oxycarbide (including SiOCH), silicon carbide nitride, silicon oxycarbide nitride, aluminum oxide, aluminum oxynitride, aluminum nitride, zirconium oxide, zirconium aluminum oxynitride, aluminum nitride, amorphous silicon, or combinations thereof.

The embodiments of the present disclosure have some advantageous features. By forming the second conductive feature to penetrate the first conductive feature and to be electrically connected to the first conductive feature and the underlying semiconductor device, the second conductive feature may replace the contact plug between the first conductive feature and the semiconductor device, thereby eliminating an interface between the contact plug and the first conductive feature to reduce electrical resistance between the first conductive feature and the semiconductor device. The second conductive feature may be formed as an elongated rail structure, which may replace multiple contact plugs and simplify the overall manufacturing process. The second conductive feature may be formed as a contact for electrical connection between the first conductive feature and the semiconductor device; alternatively, the second conductive feature may be formed as a deep power rail for providing sufficient electrical power to the semiconductor device, thereby ameliorating voltage degradation issue associated with insufficient electrical power provision due to dimensional shrinkage of conductive wires. The second conductive feature may be made of a material selected based on that of the first conductive feature and according to practical requirements, such as ultra low resistance, low capacitance, reliability or other variations, which allow the semiconductor structure to be flexibly designed according to practical requirements. The semiconductor structure may be integrated with the air gap or multiple sub-layers of the dielectric layer filling the through-hole structure in the first conductive feature, thereby lowering the overall dielectric constant of the semiconductor structure.

In accordance with some embodiments, a semiconductor structure includes a substrate, a dielectric layer, a first conductive feature and a second conductive feature. The substrate includes a semiconductor device. The dielectric layer is disposed on the substrate. The first conductive feature is formed in the first dielectric layer. The second conductive feature penetrates the first conductive feature and the dielectric layer, and is electrically connected to the first conductive feature and the semiconductor device.

In accordance with some embodiments, a semiconductor structure includes a substrate, a first dielectric layer, an interconnect structure and a second conductive feature. The substrate includes a transistor. The first dielectric layer is disposed on the substrate. The interconnect structure includes a first conductive feature that is disposed on the first dielectric layer opposite to the substrate, and a second dielectric layer that surrounds the first conductive feature. The second conductive feature penetrates the interconnect structure, and is electrically connected to the first conductive feature and the transistor.

In accordance with some embodiments, a method for making a semiconductor structure includes: providing a substrate that includes a semiconductor device; forming a dielectric layer on the substrate; forming a first conductive feature in the dielectric layer, the first conductive feature being separated from the substrate; forming a through hole that penetrates the first conductive feature and the dielectric layer to expose a contact of the semiconductor device; and forming a second conductive feature in the through hole in such a manner that the second conductive feature is electrically connected to the first conductive feature and the contact of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor structure, comprising:
   forming a dielectric layer to cover a transistor;
   forming a first conductive feature in the dielectric layer, the first conductive feature being electrically isolated from the transistor;
   after forming the first conductive feature, forming a through hole that penetrates the first conductive feature and the dielectric layer to expose a contact of the transistor; and
   forming a second conductive feature in the through hole so as to permit the first conductive feature to be electrically connected to the contact of the transistor through the second conductive feature.

2. The method as claimed in claim 1, wherein the first conductive feature and the second conductive feature are made of different materials, each of the first conductive feature and the second conductive feature having a top surface that faces away from the transistor, and a bottom surface that confronts the transistor, the top surface of the first conductive feature being flush with the top surface of the second conductive feature.

3. The method as claimed in claim 1, wherein:
   the first conductive feature is made of a material including copper, ruthenium, tungsten, titanium, aluminum, cobalt, molybdenum, iridium, rhodium, cobalt-tungsten-phosphorus or combinations thereof; and
   the second conductive feature is made of a material including copper, ruthenium, tungsten, titanium, aluminum, cobalt, molybdenum, iridium, rhodium, cobalt-tungsten-phosphorus or combinations thereof.

4. The method as claimed in claim 1, wherein:
   the through hole is defined by a hole-defining wall;
   the method further comprises:
      after the formation of the through hole and before the formation of the second conductive feature, conformally forming an electrically conductive barrier layer on the hole-defining wall, and conformally forming an electrically conductive liner layer on the electrically conductive barrier layer; and
      after the formation of the second conductive feature, the second conductive feature is surrounded by and connected to the electrically conductive liner layer.

5. The method as claimed in claim 1, wherein forming the through hole is conducted by using a photoresist as a mask to etch through the first conductive feature and the dielectric layer.

6. The method as claimed in claim 1, wherein, in forming the through hole, the through hole is defined by a hole-defining wall that forms an included angle with the transistor, the included angle ranging from 72 degrees to 90 degrees, such that the second conductive feature in the through hole has an outer wall that forms another included angle with the transistor, the another included angle between the outer wall and the transistor ranging from 72 degrees to 90 degrees.

7. The method as claimed in claim 1, wherein, in forming the through hole, the contact of the transistor is partially removed.

8. A method for making a semiconductor structure, comprising:
   forming a dielectric layer to cover a transistor;
   forming a first conductive feature on the dielectric layer opposite to the transistor, the first conductive feature being electrically isolated from the transistor; and
   after forming the first conductive feature, forming a second conductive feature that penetrates the first conductive feature and the dielectric layer so as to permit the first conductive feature to be electrically connected to the transistor through the second conductive feature.

9. The method as claimed in claim 8, wherein the first conductive feature and the second conductive feature are made of different materials.

10. The method as claimed in claim 8, wherein
   the first conductive feature includes copper, ruthenium, tungsten, titanium, aluminum, cobalt, molybdenum, iridium, rhodium, graphene, or combinations thereof, and
   the second conductive feature includes copper, ruthenium, tungsten, titanium, aluminum, cobalt, molybdenum, iridium, rhodium, cobalt-tungsten-phosphorus, or combinations thereof.

11. The method as claimed in claim 8, further comprising:
   forming a barrier layer to surround the second conductive feature; and
   forming a liner layer between the barrier layer and the second conductive feature.

12. The method as claimed in claim 11, wherein each of the barrier layer and the liner layer is made of a conductive material including tantalum, tantalum nitride, cobalt, ruthenium, titanium, titanium nitride, manganese nitride, or combinations thereof.

13. The method as claimed in claim 8, wherein the second conductive feature has an outer wall that forms an included angle with a top surface of a contact of the transistor, the included angle ranging from 72 degrees to 90 degrees.

14. The method as claimed in claim 8, wherein the transistor includes a source region, a drain region and a contact formed on one of the source region and the drain region, the second conductive feature being formed to permit electrical connection with the contact of the transistor.

15. A method for making a semiconductor structure, comprising:
   forming a first dielectric layer on at least one transistor that is partly formed in a substrate;
   forming an interconnect structure that includes
      a second dielectric layer formed on the first dielectric layer, and a first conductive feature formed in the second dielectric layer, the first conductive feature being electrically isolated from the at least one transistor; and after forming the interconnect structure, forming a second conductive feature in a way that the second conductive feature penetrates the interconnect structure and the first dielectric layer to permit the first conductive feature to be electrically connected to the at least one transistor through the second conductive feature.

16. The method as claimed in claim 15, further comprising:

forming a glue layer between the first dielectric layer and the first conductive feature;

forming a barrier layer to surround the second conductive feature in a way that the barrier layer is formed to separate the second conductive feature from the interconnect structure, the first dielectric layer and the at least one transistor; and forming a liner layer between the barrier layer and the second conductive feature.

17. The method as claimed in claim 15, wherein the first conductive feature includes multiple conductive components that are spaced apart from each other through the second dielectric layer, and the second conductive feature is formed to penetrate the first dielectric layer and at least one of the multiple conductive components so as to permit the at least one of the multiple conductive components to be electrically connected to the at least one transistor through the second conductive feature.

18. The method as claimed in claim 15, wherein the at least one transistor includes a contact, the second conductive feature has a bottom surface that is disposed on the contact of the at least one transistor, and the first conductive feature has a top surface facing away from the at least one transistor, and a bottom surface that confronts the at least one transistor and that is disposed on the first dielectric layer, the bottom surface of the first conductive feature being at a higher level than the bottom surface of the second conductive feature.

19. The method as claimed in claim 18, wherein the second conductive feature is partially landed on the contact of the at least one transistor.

20. The method as claimed in claim 15, wherein the at least one transistor includes multiple transistors, each including a contact, the first dielectric layer is formed on the multiple transistors, and the second conductive feature is formed to permit the first conductive feature to be electrically connected with the contact of each of the multiple transistors through the second conductive feature.

* * * * *